United States Patent
Stein et al.

(10) Patent No.: US 7,620,088 B2
(45) Date of Patent: Nov. 17, 2009

(54) SURFACE EMITTING-SEMICONDUCTOR LASER COMPONENT FEATURING EMISSION IN A VERTICAL DIRECTION

(75) Inventors: Wilhelm Stein, Lindau (DE); Tony Albrecht, Bad Abbach (DE); Peter Brick, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 146 days.

(21) Appl. No.: 11/597,951

(22) PCT Filed: Apr. 29, 2005

(86) PCT No.: PCT/DE2005/000791
§ 371 (c)(1),
(2), (4) Date: Sep. 14, 2007

(87) PCT Pub. No.: WO2005/117070
PCT Pub. Date: Dec. 8, 2005

(65) Prior Publication Data
US 2008/0165811 A1    Jul. 10, 2008

(30) Foreign Application Priority Data
May 28, 2004  (DE) ................. 10 2004 026 163
Aug. 18, 2004  (DE) ................. 10 2004 040 077

(51) Int. Cl.
*H01S 5/00*     (2006.01)
*H01S 3/10*     (2006.01)

(52) U.S. Cl. .............. 372/50.124; 372/21; 372/22; 372/27

(58) Field of Classification Search .......... 372/27, 372/50.124, 21, 22
See application file for complete search history.

(56) References Cited

U.S. PATENT DOCUMENTS

| 5,317,587 | A |   | 5/1994 | Ackley et al. |
| 5,459,746 | A |   | 10/1995 | Itaya et al. |
| 5,724,376 | A | * | 3/1998 | Kish et al. ............ 372/96 |
| 6,243,407 | B1 |  | 6/2001 | Mooradian |

(Continued)

FOREIGN PATENT DOCUMENTS

DE         102 03 809 A1     8/2003

(Continued)

OTHER PUBLICATIONS

M. A. Matin et al., "Optically transparent indium-tin-oxide (ITO) ohmic contacts in the fabrication of vertical cavity surface-emitting lasers", Electronics Letters, vol. 30, No. 4, pp. 318-320, Feb. 17, 1994.*

(Continued)

*Primary Examiner*—Armando Rodriguez
(74) *Attorney, Agent, or Firm*—Cohen Pontani Lieberman & Pavane LLP

(57) ABSTRACT

A surface-emitting semiconductor laser component, in particular an electrically pumped semiconductor laser component, featuring emission in a vertical direction. The component is provided for the generation of laser radiation by means of an external optical resonator (4, 5). The component comprises a semiconductor body with a semiconductor layer sequence (2) having a lateral main direction of extension and an active zone (3) provided for generation of radiation. A radiation-transmissive contact layer (6) is arranged within the resonator and is electrically conductively connected to the semiconductor body.

20 Claims, 4 Drawing Sheets

U.S. PATENT DOCUMENTS

| | | | |
|---|---|---|---|
| 6,393,038 | B1 | 5/2002 | Raymond et al. |
| 6,744,805 | B2 * | 6/2004 | Wang et al. .................... 372/99 |
| 6,778,582 | B1 * | 8/2004 | Mooradian ................... 372/97 |
| 2003/0031221 | A1 | 2/2003 | Wang et al. |
| 2003/0123495 | A1 | 7/2003 | Cox |
| 2003/0141604 | A1 | 7/2003 | Eisert et al. |

FOREIGN PATENT DOCUMENTS

| | | |
|---|---|---|
| WO | WO 98/43329 | 10/1998 |
| WO | WO 01/67563 A2 | 9/2001 |
| WO | WO 02/27877 A | 4/2002 |

OTHER PUBLICATIONS

C.L. Chua et al., "Indium Tin Oxide Transparent Electrodes for Broad-Area Top-Emitting Vertical-Cavity Lasers Fabricated Using a Single Lithography Step", IEEE Photonics Technology Letters, vol. 9, No. 5, pp. 551-553, May 5, 1997.

El Kurdi et al., "Room temperature continuous-wave laser operation of electrically-pumped 1.55 microns VECSEL", Electronics Letters, IEEE, vol. 40, No. 11, May 27, 2004 pp. 671-672.

Chua et al., "Buried oxide vertical-cavity surface-emitting laser arrays with transparent top electrodes", Technical Digest. Summaries of Papers Presented at the Conference on Lasers and Electro-Optics, Conference Edition, 1998 Technical Digest Series, vol. 6 (IEEE Cat. No. 98 CH36178) Opt. Soc. America Washington, DC, USA, 1998, pp. 370-371.

* cited by examiner

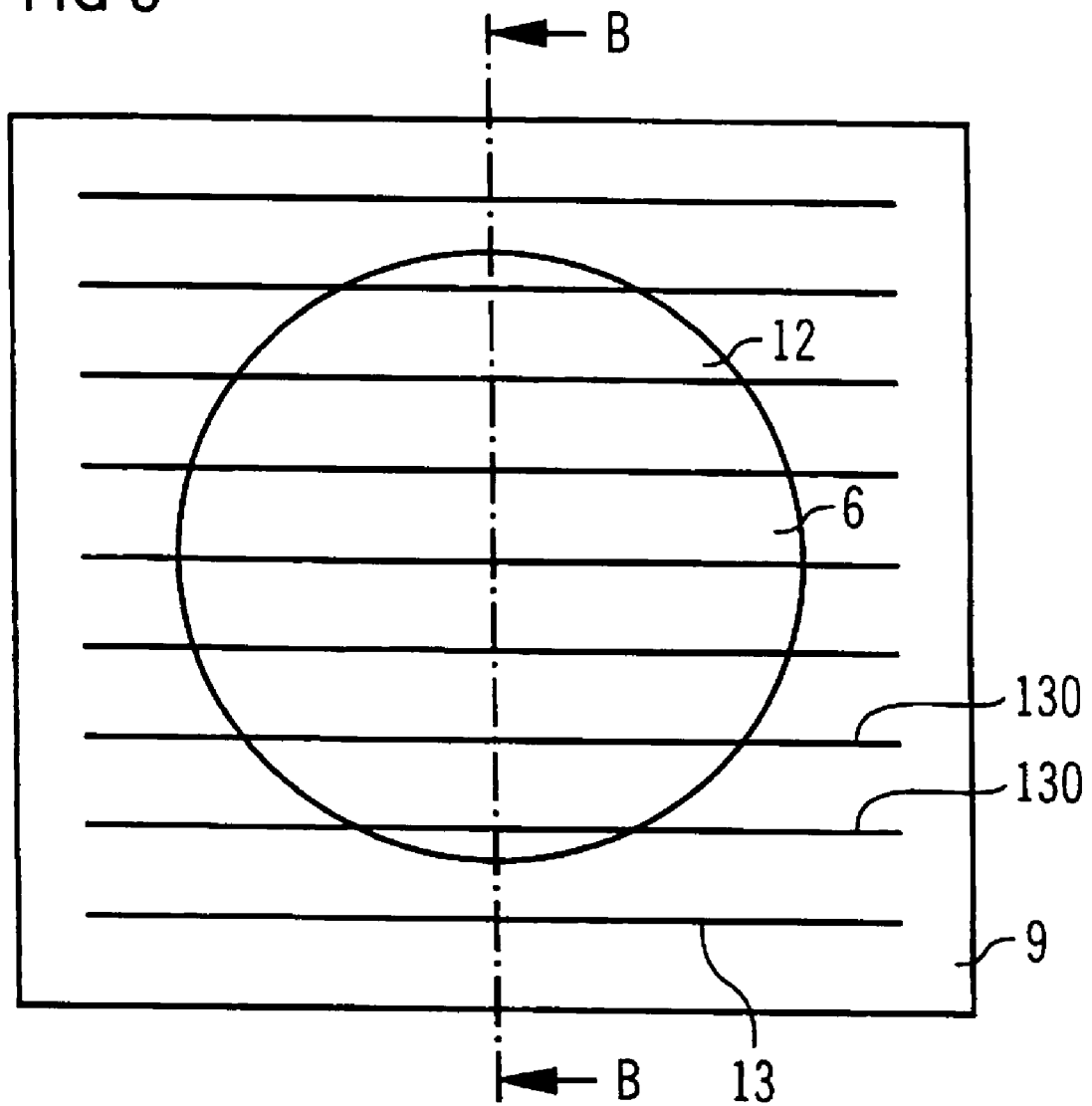

SURFACE EMITTING-SEMICONDUCTOR LASER COMPONENT FEATURING EMISSION IN A VERTICAL DIRECTION

RELATED APPLICATIONS

This is a U.S. national stage of application No. PCT/DE2005/000791, filed on Apr. 29, 2005.

This patent application claims the priority of German patent application no. 10 2004 026 163.6 filed May 28, 2004 and 10 2004 040 077.6 filed Aug. 18, 2004, the disclosure content of both of which are hereby incorporated by reference.

FIELD OF THE INVENTION

The invention relates to a surface-emitting semiconductor laser component, in particular an electrically pumped semiconductor laser component, featuring emission in a vertical direction, which is provided for the generation of laser radiation by means of an optical resonator, and comprises a semiconductor body with a semiconductor layer sequence having a lateral main direction of extension and an active zone provided for generation of radiation.

BACKGROUND OF THE INVENTION

In conventional electrically pumped surface-emitting semiconductor laser components, owing to the usually low conductivity of the semiconductor materials of the semiconductor body in a lateral direction, the pump current is often injected into the semiconductor body from the n-conducting side thereof via a current spreading layer. By way of example, layers made of III-V semiconductor materials, such as n-GaAs, are used for this purpose. However, current spreading layers of this type frequently likewise have a low conductivity in a lateral direction, said conductivity often being comparable to that of the semiconductor body, or absorb the radiation generated in the active zone. On account of the low conductivity, a current spreading layer of this type, for efficient current injection, often has to be embodied with a large thickness, as a result of which the radiation power absorbed in the current spreading layer is increased, however. Overall, the risk of a reduction of the efficiency of the semiconductor laser component is increased on account of the low conductivity in a lateral direction and/or the absorption.

SUMMARY OF THE INVENTION

One object of the invention is to provide an improved surface-emitting semiconductor laser component.

This and other objects are attained in accordance with one aspect of the invention directed to a surface-emitting semiconductor laser component according to the invention featuring emission in a vertical direction, which is provided for the generation of laser radiation by means of an external optical resonator, comprises a semiconductor body with a semiconductor layer sequence having a lateral main direction of extension and an active zone provided for generation of radiation, a radiation-transmissive contact layer being arranged within the resonator and being electrically conductively connected to the semiconductor body.

The semiconductor laser component is preferably electrically pumped by means of the radiation-transmissive contact layer.

Absorption losses in an absorbent current spreading layer can be advantageously reduced as a result, which has an advantageous effect on the efficiency and/or the laser activity threshold of the component.

If appropriate, an absorbent current spreading layer having a lower transmission than the contact layer may also be provided in addition to the radiation-transmissive contact layer. The thickness of said current spreading layer may advantageously be reduced, however, compared with conventional semiconductor laser components.

Preferably, the conductivity of the contact layer in a lateral direction is high enough to enable a homogeneous current impression of the pump current into the semiconductor body by means of the contact layer. Particularly preferably, the contact layer has a conductivity or structure in a lateral direction such that the lateral pump current density is greater over the central region of the semiconductor body than over the edge region of the semiconductor body over which the current is preferably impressed into the contact layer.

The lateral pump current density may essentially have a quasi-Gaussian profile with a maximum in the central region, proceeding from the maximum comparatively shallow flanks in the central region and flanks becoming steeper in the edge region.

By means of the contact layer, it is possible to achieve a pump current density distribution which is essentially homogeneous in lateral direction in the central region above the semiconductor body over a comparatively large lateral region, for example having a lateral extent of 10-10000 μm, preferably 100 μm to 1000 μm or 100 μm to 500 μm.

The contact layer is furthermore preferably arranged on the semiconductor body. It is thereby possible to achieve an advantageously efficient current impression into the semiconductor body. The contact layer is particularly preferably distinguished by advantageous electrical contact properties with respect to the semiconductor body. By way of example, the contact layer forms an essentially ohmic contact with the semiconductor body.

In one preferred configuration of the invention, the contact layer contains an oxide, in particular a metal oxide. Radiation-transmissive conductive oxides (TCO: Transparent Conducting Oxide), in particular metal oxides, are distinguished by high radiation transmissivity over a wide wavelength range in conjunction with high conductivities in lateral direction. The contact layer may contain or comprise, for example, one or a plurality of TCO materials, for instance a zinc oxide, such as ZnO, an indium tin oxide, such as ITO, a tin oxide, such as $SnO_2$, or a titanium oxide, such as $TiO_2$. In order to increase the conductivity, the contact layer may be doped, preferably with a metal. By way of example, ZnO may be doped with Al.

The contact layer preferably contains ZnO or ITO. ZnO is distinguished by particularly advantageous contact properties with respect to p-conducting semiconductor materials.

ZnO, for example, approximately has an absorption coefficient of 0 for wavelengths of between 400 nm and approximately 1100 nm and an absorption coefficient of 0.1 or less for wavelengths of between approximately 340 nm and 1200 nm. By way of example, ITO approximately has an absorption coefficient of 0 for wavelengths of greater than 500 nm to 1000 nm and beyond and an absorption coefficient of 0.1 or less for wavelengths of 400 to 500 nm. Such low absorption coefficients correspond to high transmission values.

Preferably, the thickness of the contact layer is 100 nm or more and is less than or equal to 1000 nm. A sheet resistance of the contact layer in lateral direction may amount to 20

$\Omega$_sq or less, by way of example. In this case, the unit $\Omega$_sq denotes the resistance of a square area (square) of the contact layer.

In one preferred configuration of the invention, the resonator is delimited by a first mirror, which is preferably formed in the semiconductor body and/or as a Bragg mirror, and at least one further external mirror.

The external mirror may be formed as a coupling-out mirror for the radiation from the resonator and for this purpose preferably has a lower reflectivity than the first mirror. The external mirror is particularly preferably spaced apart from the semiconductor body by way of a region of free radiation propagation.

The radiation generated in the active zone can be reflected between the first mirror and the external mirror in such a way that there is formed in the resonator a radiation field for the generation of coherent radiation (laser radiation) by means of induced emission in the active zone, which can be coupled out from the resonator via the coupling-out mirror.

In accordance with an advantageous development of the invention, the contact layer is arranged in the direct beam path between the active zone and the external mirror of the resonator.

High output powers can be achieved by means of surface-emitting semiconductor laser components with an external resonator (VECSEL: Vertical External Cavity Surface Emitting Laser or semiconductor disk laser) compared with components with an internal resonator (VCSEL: Vertical Cavity Surface Emitting Laser).

In accordance with a further preferred configuration of the invention, the active zone comprises a single or multiple quantum well structure. Structures of this type are particularly suitable for semiconductor laser components. If appropriate, the active zone may also comprise one or a plurality of quantum dots or one or a plurality of quantum wires.

In a further preferred configuration of the invention, an optical coating is provided between semiconductor body and contact layer or on that side of the contact layer which is remote from the semiconductor body.

In accordance with an advantageous development of the invention, the optical coating is at least partly formed as an antireflection coating or highly reflective coating for radiation or radiation modes in the resonator. By means of a highly reflective coating, the laser activity threshold can be reduced by means of a reflection-dictated increased proportion of induced emission in the active zone, reduced radiation power being coupled out from the resonator as a consequence. An antireflection coating can lead to an increased threshold with consequently increased coupled-out radiation power.

The antireflection coating or highly reflective coating may for example be embodied in layered fashion and comprise one or a plurality of layers, if appropriate of different materials.

Said layers are preferably arranged according to the desired highly reflective or antireflective properties with regard to their, if appropriate different, refractive indices and/or thicknesses (e.g. in the form of one or a plurality of $\lambda$/4 layers). By way of example, at least one of the further layers contains an essentially dielectric material. In particular, the contact layer may be embodied as a layer of the optical coating.

Particularly preferably, the optical coating directly adjoins the contact layer.

In a further preferred configuration of the invention, in the resonator a selection element is provided or the contact layer is embodied as a selection element. The selection element is preferably formed for wavelength selection and/or for polarization selection of the radiation in the resonator. Specific wavelengths and/or polarizations of the radiation in the resonator may be preferred over other wavelengths and/or polarizations by means of suitable formation of the selection element. By this means it is possible, if appropriate, to influence the wavelength and/or the polarization state of the radiation emitted by the semiconductor laser component.

In particular, the polarization of radiation in the resonator may be stabilized in this way so as to make it more difficult for the polarization of the radiation to deviate from the polarization predetermined by the selection element, for instance linear polarization (e.g. s-polarized or p-polarized).

In accordance with an advantageous development of the invention, the selection element comprises a grating structure. The selection properties of the selection element can be set by means of the grating parameters such as the arrangement and spacings of grating lines with correspondingly resulting diffraction or reflection of radiation at the grating structure.

In accordance with a further preferred configuration of the invention, the semiconductor body is arranged on a carrier, which preferably mechanically stabilizes the semiconductor body.

The carrier preferably emerges from a carrier layer on which a semiconductor layer system, which is preferably provided for the formation of a plurality of semiconductor bodies and comprises a corresponding sequence of semiconductor layers, is arranged in the wafer assembly.

A plurality of semiconductor bodies which are arranged on the common carrier layer can be patterned from the semiconductor layer system, for example by means of photolithographic methods in combination with etching processes. The carrier may emerge from the carrier layer for example during the singulation of this structure into semiconductor chips (at least one semiconductor body arranged on the carrier).

The carrier layer may comprise or be formed from, in particular, a growth substrate of the semiconductor layer system on which the semiconductor layer system is grown, preferably epitaxially.

However, the carrier layer may also be different from the growth substrate of the semiconductor layer system.

By way of example, such a carrier may contain a semiconductor material which is different from the growth substrate or a metal and/or be formed as a heat sink.

If the carrier is different from the growth substrate of the semiconductor layer system, it is possible, by way of example, during production, for the semiconductor layer system arranged on the growth substrate or the plurality of semiconductor bodies to be fixed, with respect to the opposite side to the growth substrate, on a carrier layer that is different from the growth substrate. By way of example, wafer bonding methods such as anodic bonding, eutectic bonding or soldering are suitable for this purpose. The growth substrate is subsequently stripped away, for example by means of a laser ablation method, a mechanical method such as grinding away, for instance, or a chemical method such as etching. During singulation, the carrier of the semiconductor body may emerge from the carrier layer that is different from the growth substrate.

However, the semiconductor body may also be arranged and/or fixed on a carrier that is different from the growth substrate after singulation, and after this, if appropriate, the growth substrate or residues of the growth substrate is or are removed from the semiconductor body.

The stripping away of the growth substrate advantageously increases the degrees of freedom with regard to the choice of carrier. The carrier does not have to satisfy the high requirements made of a growth substrate, but rather can be chosen comparatively freely with regard to advantageous properties, such as high thermal and/or electrical conductivity.

In a further preferred configuration of the invention, the semiconductor body is prefabricated and the contact layer is applied to the semiconductor body after the fabrication thereof. Semiconductor body and contact layer can thus be produced by means of different methods and/or successively. The semiconductor body may be produced by means of epitaxy, for example, and a, preferably TCO-containing, contact layer may be applied to the semiconductor body after the epitaxy phase has ended, for instance by means of sputtering.

It should be noted that prefabrication of the semiconductor body is also to be understood to mean the prefabrication of a semiconductor layer system which is provided for the formation of a plurality of semiconductor bodies.

In an in turn further preferred configuration of the invention, a nonlinear optical element, preferably for frequency conversion, is arranged in the resonator. By way of example, the nonlinear optical element is formed as a frequency doubler (SHG: Second Harmonic Generation). The nonlinear optical element is preferably formed for the frequency conversion of radiation in the non-visible spectral range, such as the infrared, into radiation in the visible spectral range.

BRIEF DESCRIPTION OF THE DRAWINGS

FIG. 3 shows a schematic plan view of a semiconductor body of a semiconductor laser component according to an embodiment of the invention.

DETAILED DESCRIPTION OF THE DRAWINGS

Elements which are identical, of identical type and act identically are provided with the same reference symbols in the Figures.

Figure 1:
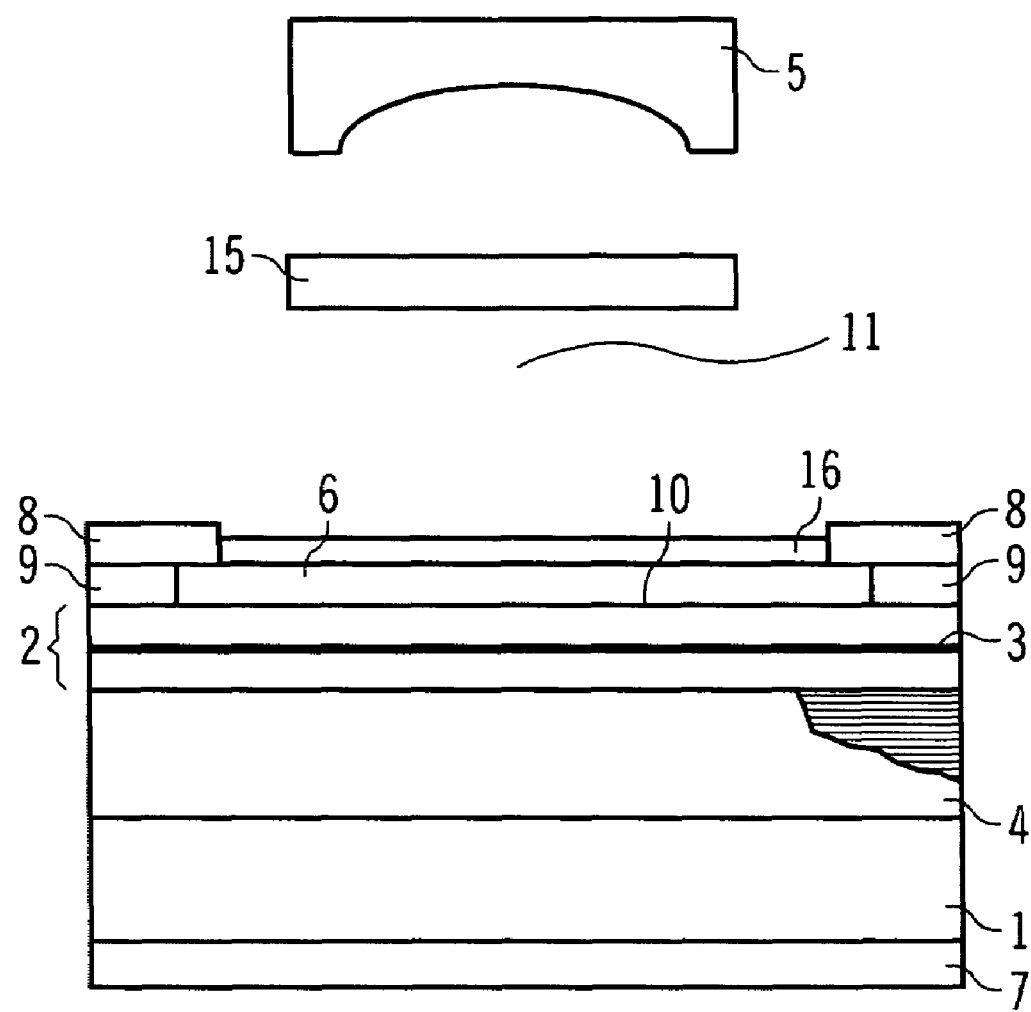
FIG. 1 shows a first exemplary embodiment of a semiconductor laser component according to the invention on the basis of a schematic sectional view.

FIG. 1 shows a first exemplary embodiment of a semiconductor laser component according to the invention on the basis of a schematic sectional view.

A semiconductor layer sequence 2, comprising an active zone 3 provided for the generation of radiation, preferably radiation having a wavelength in the infrared spectral range, is arranged on a carrier 1.

The active zone is formed as a multiple quantum well structure, by way of example.

A Bragg mirror 4 is arranged between the active zone 3 and the carrier 1, which Bragg mirror, together with an external mirror 5, forms an optical resonator for the radiation generated in the active zone 3. In this exemplary embodiment, the Bragg mirror 4 is integrated together with the semiconductor layer sequence 2 into the semiconductor body of the semiconductor laser component.

In a preferred configuration of the invention, the semiconductor laser component, in particular the semiconductor body or the active zone, contains at least one III-V semiconductor material, for instance a semiconductor material from the material systems $In_xGa_yAl_{1-x-y}P$, $In_xGa_yAl_{1-x-y}As$ or $In_xGa_yAl_{1-x-y}N$ where $0 \leq x \leq 1$, $0 \leq y \leq 1$ and $x+y \leq 1$. The semiconductor body may also contain a semiconductor material from the III-V semiconductor material system $In_yGa_{1-y}As_xP_{1-x}$ where $0 \leq x \leq 1$ and $0 \leq y \leq 1$.

These materials are distinguished by high internal quantum efficiencies that can be achieved in a simplified manner, and are suitable for radiation from the ultraviolet (in particular $In_xGa_yAl_{1-x-y}N$) through the visible (in particular $In_xGa_yAl_{1-x-y}N$, $In_xGa_yAl_{1-x-y}P$), to the infrared spectral range (in particular $In_xGa_yAl_{1-x-y}As$, $In_yGa_{1-y}As_xP_{1-x}$).

The semiconductor body is preferably based on the material system $In_xGa_yAl_{1-x-y}As$. Radiation in the infrared spectral range, in particular in the wavelength range between 800 nm and 1100 nm, can be generated particularly efficiently in this material system. By way of example, the carrier contains GaAs and the semiconductor layer sequence is based on the material system $In_xGa_yAl_{1-x-y}As$ where $0 \leq x \leq 1$, $0 \leq y \leq 1$ and $x+y \leq 1$.

In a further preferred configuration of the invention, a wavelength of the radiation generated in the active zone lies in the spectral range between 200 nm and 2000 nm. The contact layer preferably has a particularly high transmission for the wavelength of the radiation generated in the active zone.

The external mirror 5 is formed as a coupling-out mirror for coupling out the laser radiation generated in the resonator by means of induced emission and has a lower reflectivity than the Bragg mirror 4. The emission profile of the coherent laser radiation coupled out from the resonator can be influenced by means of the arrangement of the external mirror or the resonator length.

The Bragg mirror has a plurality of semiconductor layer pairs with an advantageously high refractive index difference. By way of example, a GaAs and an AlGaAs λ/4 layer in each case form a semiconductor layer pair. The plurality of layer pairs in the Bragg mirror 4 is indicated schematically in FIG. 1. The Bragg mirror preferably comprises a sequence of 20 to 30 or more semiconductor layer pairs, which results in a total reflectivity of the Bragg mirror of 99.9% or more for the laser radiation. The Bragg mirror is advantageously produced together with the semiconductor layer sequence, for example epitaxially.

On that side of the semiconductor layer sequence 2 which is remote from the carrier 1, a contact layer 6 transmissive to the generated radiation, for instance containing or comprising ZnO doped with Al, e.g. with a concentration of 2%, is arranged above a contact region of the semiconductor layer sequence. The contact layer 6 is electrically conductively connected to the semiconductor layer sequence. The contact layer is preferably arranged directly on the semiconductor layer sequence. The electrical contact between semiconductor layer sequence and contact layer preferably has an essentially ohmic characteristic. The semiconductor laser component is electrically pumped by means of a first connection 7, which is arranged on that side of the carrier which is remote from the semiconductor layer sequence 2, and a second connection 8, which is arranged on that side of the semiconductor layer sequence which is opposite to the carrier, for example in each case containing at least one metal.

In order to avoid absorption in the second connection 8, for instance a metallic connection, the layered second connection 8 is cut out above the central region of the semiconductor layer sequence and runs for example annularly over the edge region of the semiconductor layer sequence. The second connection 8 is electrically conductively connected to the contact layer 6 and may contain for example Ti, Al, Pt or alloys with at least one of said materials.

An insulation layer 9 is preferably arranged between the second connection 8 and the semiconductor layer sequence 2, said insulation layer having a cutout having a lateral extent which preferably at least in partial regions is greater than that of the cutout in the second connection, so that an overlap between connection and contact layer arises in said partial regions. An electrical pumping of the edge region of the active zone that is arranged below the insulation layer is thus advantageously avoided on account of the low conductivity—compared with the contact layer—of the semiconductor layer sequence in a lateral direction and a current injection via the contact layer predominantly in the central region.

The insulation layer 9 may contain for example a silicon nitride, a silicon oxide or a silicon oxynitride. Preferably, the insulation layer is simultaneously formed as a passivation layer which advantageously increases the protection of the semiconductor body against harmful external influences.

Current fed into the contact layer via the second connection 8 is injected into the semiconductor layer sequence predominantly via the central region of the semiconductor body on account of the advantageously high transverse conductivity of the contact layer 6 in a lateral direction. The charge carriers which are injected homogeneously into the active zone over a large area via the whole-area first connection 7, the carrier 1 and the Bragg mirror 4 can recombine radiatively with the charge carriers which are injected into the active zone 3 via the second connection 8 and the contact layer 6. The radiative recombination or generation of radiation takes place predominantly in the central region of the active zone on account of the comparatively low transverse conductivity of the semiconductor layer sequence.

In the case of the invention, the current path of the pump current in the semiconductor body can be determined by the contact area of the contact layer with the semiconductor body and the formation of the insulation layer. Additional, comparatively complicated measures for guiding current in the semiconductor body, for instance targeted electrical spoiling by means of implantation or oxide apertures in the edge region within the semiconductor body or the semiconductor layer sequence can advantageously be dispensed with.

Radiation generated in the active zone is emitted from the semiconductor body in a vertical direction on the part of the surface 10, passes via a region of free radiation propagation 11 and impinges on the external mirror 5.

In accordance with a preferred configuration of the invention, the semiconductor layer sequence comprises at least one p-conducting semiconductor layer, preferably on its side facing the contact layer as seen from the active zone. Particularly preferably, a region of the semiconductor layer sequence between the contact layer and the active zone is formed in p-conducting fashion and/or a region between the Bragg mirror and the active zone is formed in n-conducting fashion. In accordance with an advantageous development of the invention, carrier and Bragg mirror are formed in n-conducting fashion.

The carrier 1 may be formed from a segment of the growth substrate of the semiconductor body on which firstly the Bragg mirror and then the semiconductor layer sequence were grown, preferably epitaxially.

In accordance with an advantageous development, the insulation layer may firstly be applied to the prefabricated semiconductor body over the whole area. After application, it is removed above the contact region of the semiconductor layer sequence. In the region in which the insulation layer has been removed, the contact layer material is applied to the semiconductor body. The contact layer, in the same way as the insulation layer, may be sputtered onto the semiconductor body or the semiconductor layer sequence.

The contact layer may be formed, if appropriate, in combination with one or a plurality of layers arranged on the part of the semiconductor body (i.e., the layers are arranged on the side of the contact layer facing the semiconductor body) or one or a plurality of, preferably essentially dielectric, layers subsequently applied to the contact layer (i.e., the layers are arranged on the side of the contact layer facing away from the semiconductor body), as highly reflective or antireflection coating 16 for radiation or radiation modes in the resonator.

If appropriate, a nonlinear optical element 15 for frequency conversion may be arranged in the resonator, preferably in the region of free radiation propagation 11.

Figure 2A:
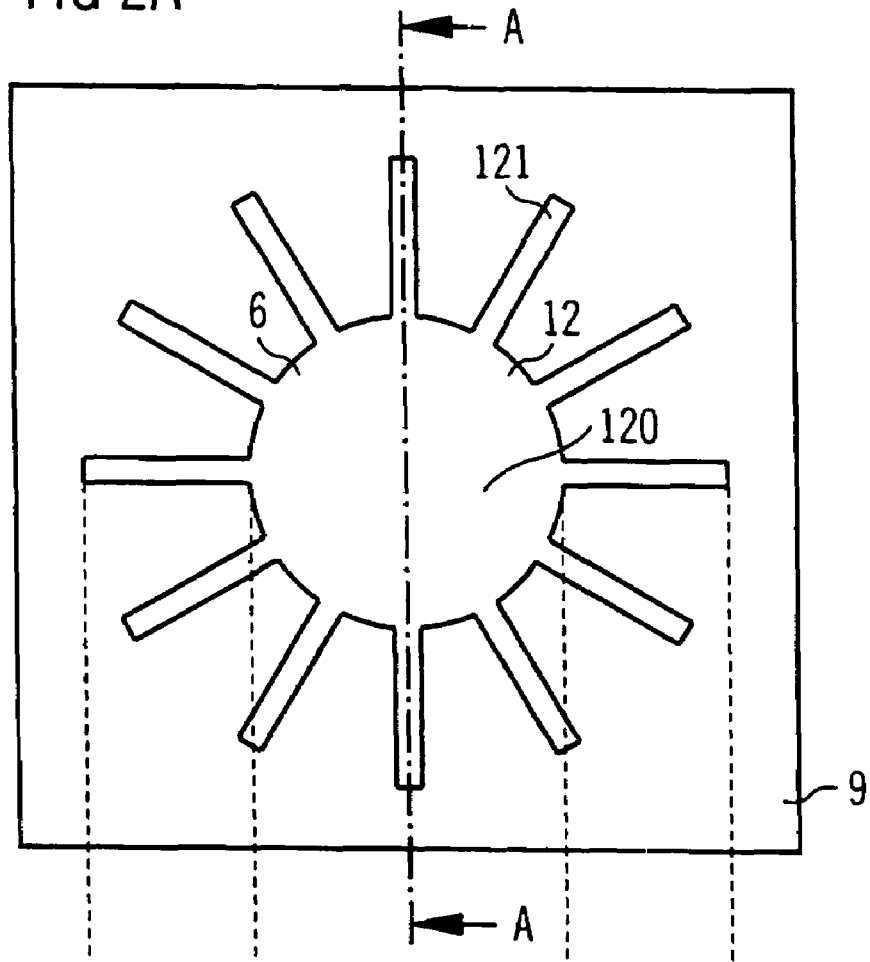
FIG. 2A shows a schematic plan view of a semiconductor body of a semiconductor laser component according to an embodiment of the invention and FIG. 2B qualitatively shows the lateral profile of the pump current density that corresponds to FIG. 2A.

FIG. 2A shows a schematic plan view of a semiconductor body of a semiconductor laser component according to the invention. A plan view from the region of free radiation propagation 11 from FIG. 1 of the contact layer therein is shown by way of example. FIG. 1 may for example essentially show a sectional view along the line A-A from FIG. 2A. An illustration of the second connection from FIG. 1 has been dispensed with.

FIG. 2A illustrates an insulation layer 9 arranged on a semiconductor body. Said insulation layer is cut out in a contact region 12 comprising a central region 120 and connection fingers 121 which preferably run essentially radially outward proceeding from the central region and occupy a comparatively small area of the contact region 12.

The contact layer 6 is applied in the cutout of the insulation layer 9 over the entire contact region 12. The formation of a cutout thus determines the form of the contact area between contact layer and semiconductor body. Via a, for example annular, connection which is conductively connected to the contact layer 6 in the region of the connection fingers 121 and is cut out above the central region 120, current can be injected into the active zone by means of the contact layer 6.

Figure 2B:
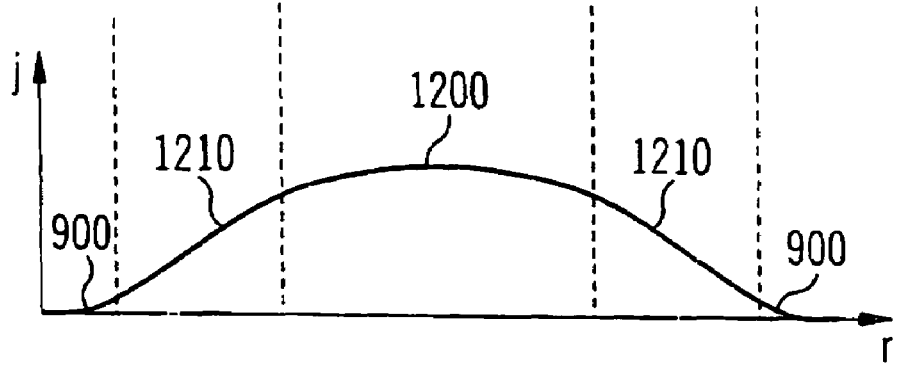

FIG. 2B qualitatively shows the dependence of the pump current density j over the semiconductor body on the part of the contact layer on the lateral position r. The sections 900 of the curve correspond to the edge regions from FIG. 2A in which the semiconductor body is covered by the insulation layer 9, the sections 1210 correspond to the connection fingers 121 and the section 1200 corresponds to the central region 120.

In the central region 120, the pump current density is comparatively high and essentially homogeneous. It decreases only slightly proceeding from a maximum in the middle region of the central region 120 in the section 1200 in the direction of the connection fingers, while it is comparatively low in the sections 900 of the edge regions in which the insulation layer 9 is arranged. In the sections 1210 of the connection fingers, the pump current density decreases comparatively greatly in the outward direction.

By means of the radiation-transmissive contact layer, it is thus possible to realize a comparatively homogeneous pump current density distribution over the lateral central region 120. The lateral extent of the central region may amount, for example, to 10-10000 μm, preferably 100 μm or more. Preferably, it is possible to realize the lateral pump current density distribution over the semiconductor body on the part of the contact layer according to a Gaussian or hypergaussian distribution.

The shape of the pump profile shown qualitatively in FIG. 2B is independent of the thickness of the contact layer over wide thickness ranges on account of the high conductivity of a contact layer material in a lateral direction. The contact layer can therefore be embodied with a comparatively small thickness, for example of 10 μm or less, within the scope of the invention.

FIG. 3 schematically illustrates a plan view of a further semiconductor body and a semiconductor laser component according to the invention.

A plan view from the region of free radiation propagation 11 from FIG. 1 of a contact layer therein is shown by way of example. FIG. 1 may for example essentially show a sectional view along the line B-B from FIG. 3. An illustration of the second connection from FIG. 1 has been dispensed with.

Here a selection element 13 is provided in the form of a grating formed by the grating lines 130. A grating structure, for example in the form of a line grating, may be introduced into the insulation layer 9 and/or the contact layer 6 by means of etching, for instance. The grating structure is preferably provided at least in the middle region of the contact region 12 in the contact layer 6 above the semiconductor body.

By means of the grating structure, in particular the spacings of the grating lines, it is possible to influence the wavelength of the radiation amplified in the resonator and hence the wavelength of the laser radiation emitted by the component. Thus, diffraction or reflection of a laser radiation mode at the grating has the effect that the losses for said mode are increased and, consequently, the laser activity threshold for said mode cannot be reached or can be reached only with greater difficulty. The diffraction or reflection properties of the grating can be set by way of the spacings of the grating lines.

The selection element may furthermore be formed for polarization stabilization by virtue of one polarization state of the one laser radiation mode being preferred over differently polarized modes by means of the grating structure.

The selection element 13 can thus act as a polarization and/or wavelength filter.

The contact region 12 and the contact layer 6 are essentially formed in circular fashion here and the contact layer can be contact-connected by suitable overlapping with a second connection for instance as illustrated schematically in FIG. 1.

Figure 4:
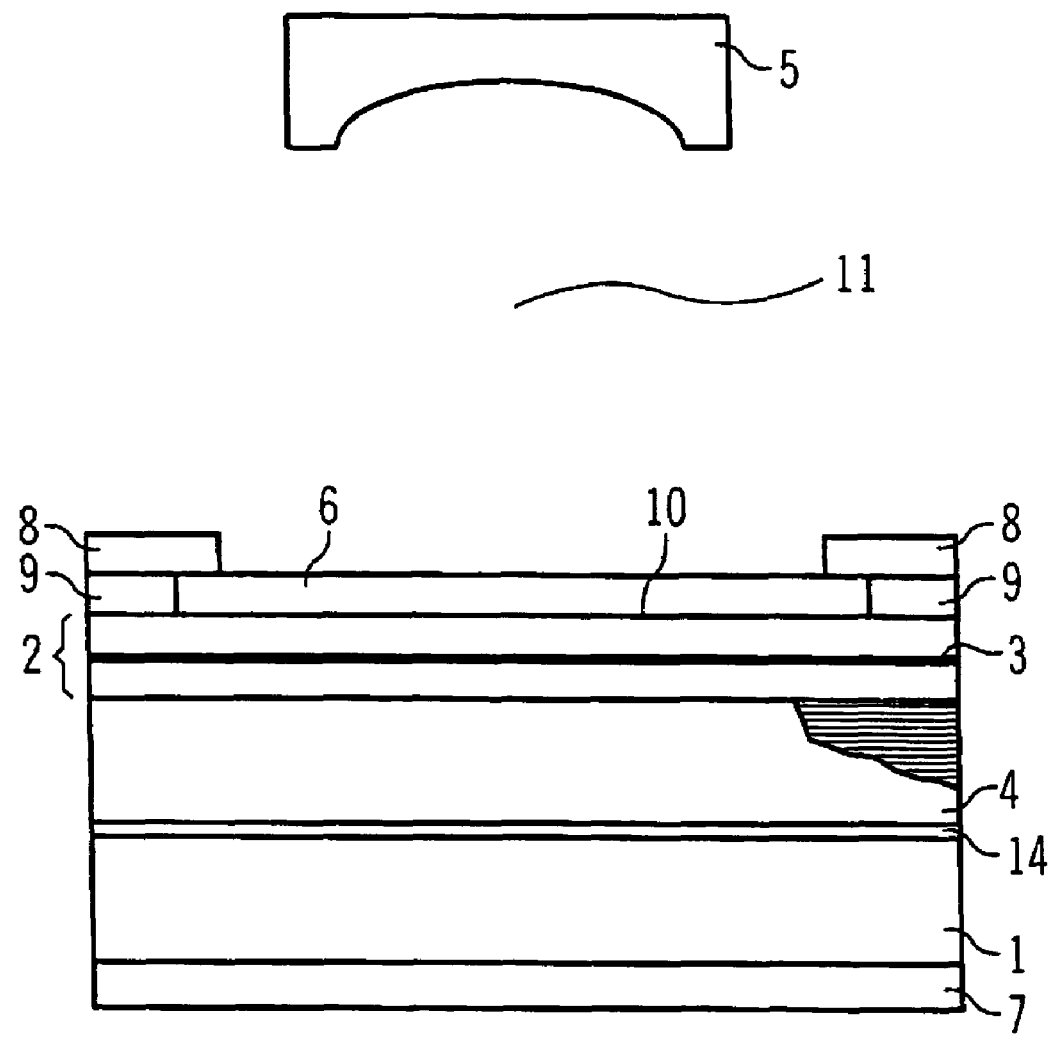
FIG. 4 shows a second exemplary embodiment of a semiconductor laser component according to the invention on the basis of a schematic sectional view.

FIG. 4 shows a second exemplary embodiment of a semiconductor laser component according to the invention on the basis of a schematic sectional view.

The semiconductor laser component illustrated in FIG. 4 essentially corresponds to that shown in FIG. 1. In contrast to the exemplary embodiment of a semiconductor laser component according to the invention as shown in FIG. 1, the semiconductor body with the Bragg mirror 4 and the semiconductor layer sequence 2 with the active zone 3 is arranged and preferably stably fixed on the carrier 1 by means of a connecting layer 14 on the part of the Bragg mirror 4. In this exemplary embodiment, the carrier 1 is preferably different from the growth substrate of the semiconductor body and comprises a heat sink, for example, which contains, for instance, CuW, CuDia, Cu, SiC or BN.

The heat sink advantageously facilitates the dissipation of heat from the active zone, thereby reducing the risk of a thermally dictated reduction of the efficiency of the component, particularly at high powers, which often also entail high heat losses.

In order to produce a component of this type, by way of example, firstly the semiconductor body is prefabricated, the Bragg mirror being produced after the semiconductor layer sequence on a growth substrate. On the part of the Bragg mirror, the semiconductor body is subsequently fixed on the carrier by means of eutectic bonding, after which the growth substrate is stripped away, e.g. by means of wet-chemical etching or a laser ablation method. The connecting layer 14 may be for example a layer formed by means of eutectic bonding. The semiconductor body in accordance with FIG. 4 may accordingly be produced in the opposite order to the semiconductor body shown in FIG. 1.

The scope of protection of the invention is not limited to the examples given hereinabove. The invention is embodied in each novel characteristic and each combination of characteristics, which includes every combination of any features which are stated in the claims, even if this combination of features is not explicitly stated in the claims or in the examples.

The invention claimed is:

1. A surface-emitting semiconductor laser component, featuring emission in a vertical direction, which is provided for the generation of laser radiation by means of an external optical resonator, comprising:
    a semiconductor body with a semiconductor layer sequence having a lateral main direction of extension and an active zone provided for generation of radiation;
    a radiation-transmissive contact layer arranged within the resonator and electrically conductively connected to the semiconductor body, wherein the radiation-transmissive contact layer is a selection element.

2. The semiconductor laser component as claimed in claim 1, wherein
    the contact layer contains an oxide.

3. The semiconductor laser component as claimed in claim 1, wherein
    the contact layer contains a TCO material.

4. The semiconductor laser component as claimed in claim 1, wherein
    the contact layer contains ZnO or ITO.

5. The semiconductor laser component as claimed in claim 1, wherein
    the contact layer is arranged on the semiconductor body.

6. The semiconductor laser component as claimed in claim 1, wherein
    the contact layer is arranged in the direct beam path between the active zone and an external mirror of the resonator.

7. The semiconductor laser component as claimed in claim 1, wherein,
    the resonator is delimited by a Bragg mirror.

8. The semiconductor laser component as claimed in claim 1, wherein
    the semiconductor body has at least one p-conducting layer on its side facing the contact layer.

9. The semiconductor laser component as claimed in claim 1 wherein
    the wavelength of the radiation generated in the active zone lies in the non-visible, preferably infrared, spectral range.

10. The semiconductor laser component as claimed in claim 1, wherein
    the semiconductor laser component is a semiconductor laser component which is electrically pumped by means of the contact layer.

11. The semiconductor laser component as claimed in claim 1, wherein
    the semiconductor body is prefabricated and the contact layer is subsequently applied to the semiconductor body.

12. The semiconductor laser component as claimed in claim 1, wherein
    the semiconductor body is arranged on a carrier.

13. The semiconductor laser component as claimed in claim 12, wherein
   the carrier is different from the growth substrate of the semiconductor layer sequence.

14. The semiconductor laser component as claimed in claim 12, wherein
   the carrier is formed as a heat sink.

15. The semiconductor laser component as claimed in claim 1, wherein
   an optical coating is provided between said semiconductor body and said contact layer or on that side of the contact layer which is remote from the semiconductor body.

16. The semiconductor laser component as claimed in claim 1, wherein
   the selection element is formed for wavelength selection and/or polarization selection of the radiation in the resonator.

17. The semiconductor laser component as claimed in claim 1, wherein
   the selection element has a grating structure.

18. The semiconductor laser component as claimed in claim 17, wherein
   the grating structure is at least partly formed in the contact layer.

19. The semiconductor laser component as claimed in claim 1, wherein
   a nonlinear optical element, preferably for frequency conversion, is arranged in the resonator.

20. The semiconductor laser component as claimed in claim 1, wherein
   a wavelength of the radiation generated in the active zone lies in the spectral range between 200 nm and 2000 nm.

* * * * *